US010477676B2

(12) United States Patent
Kim (10) Patent No.: US 10,477,676 B2
(45) Date of Patent: Nov. 12, 2019

(54) DISPLAY DEVICE (71) Applicant: SAMSUNG DISPLAY CO., LTD., Yongin-si, Gyeonggi-do (KR)

(72) Inventor: Youngkwang Kim, Suwon-si (KR)

(73) Assignee: Samsung Display Co., Ltd. (KR)

( * ) Notice: Subject to any disclaimer, the term of this patent is extended or adjusted under 35 U.S.C. 154(b) by 20 days.

(21) Appl. No.: 15/829,143

(22) Filed: Dec. 1, 2017

(65) Prior Publication Data
US 2018/0160527 A1 Jun. 7, 2018

(30) Foreign Application Priority Data

Dec. 1, 2016 (KR) .................. 10-2016-0162791

(51) Int. Cl.
*H05K 7/00* (2006.01)
*H05K 1/02* (2006.01)
(Continued)

(52) U.S. Cl.
CPC ....... *H05K 1/0268* (2013.01); *G02F 1/13452* (2013.01); *H05K 1/028* (2013.01); *H05K 1/0271* (2013.01); *H05K 1/147* (2013.01); *H05K 1/181* (2013.01); *G02B 6/0055* (2013.01); *G02B 6/0083* (2013.01); *G02B 6/0088* (2013.01); *G02F 1/1368* (2013.01);
(Continued)

(58) Field of Classification Search
CPC ............... G02B 6/0055; G02B 6/0088; G02F 1/133308; G02F 1/13452; G02F 1/1368; G02F 2001/133314; G02F 2001/133317; G02F 2001/13332; H05K 1/0268; H05K 1/0271; H05K 1/028; H05K 1/147; H05K 1/181
See application file for complete search history.

(56) References Cited

U.S. PATENT DOCUMENTS 6,111,414 A * 8/2000 Chatterjee .......... G01R 31/2853
324/633
7,129,719 B2 * 10/2006 Jung .................. G01R 31/2853
324/718
(Continued)

FOREIGN PATENT DOCUMENTS

JP    2008096127 A    4/2008
KR    10-2008-0098087    11/2008
(Continued)

*Primary Examiner* — Yuriy Semenenko
(74) *Attorney, Agent, or Firm* — Innovation Counsel LLP (57) ABSTRACT A display device is capable of detecting defects of a PCB, the display device including: a display panel on which a driving integrated circuit is mounted; a printed circuit board disposed on at least one edge of the display panel and connected to the driving integrated circuit; signal lines disposed on the printed circuit board; and an inspection portion connected to signal lines. The inspection portion includes: a power line connected to one point of at least two signal lines of signal lines to apply an inspection signal, the at least two signal lines including a first signal line and a second signal line; a first resistor connected to the first signal line; a second resistor connected to the second signal line; and a signal detection line connected to the first resistor and the second resistor to detect a change value of the inspection signal.

11 Claims, 5 Drawing Sheets (51) Int. Cl.
*H05K 1/18* (2006.01)
*G02F 1/1345* (2006.01)
*H05K 1/14* (2006.01)
*F21V 8/00* (2006.01)
*G02F 1/1333* (2006.01)
*G02F 1/1368* (2006.01)

(52) U.S. Cl.
CPC ............. *G02F 1/133308* (2013.01); *G02F 2001/13332* (2013.01); *G02F 2001/133314* (2013.01); *G02F 2001/133317* (2013.01); *H05K 1/189* (2013.01); *H05K 2201/056* (2013.01); *H05K 2201/1003* (2013.01); *H05K 2201/10015* (2013.01); *H05K 2201/10022* (2013.01); *H05K 2201/10053* (2013.01); *H05K 2201/10136* (2013.01); *H05K 2201/10522* (2013.01)

(56) References Cited

U.S. PATENT DOCUMENTS

| | | | |
|---|---|---|---|
| 8,482,310 B2 | 7/2013 | Kim et al. | |
| 8,742,777 B2* | 6/2014 | Kim | G01R 31/2822 324/500 |
| 2003/0016026 A1* | 1/2003 | Kawaike | G01R 31/315 324/537 |
| 2005/0129104 A1* | 6/2005 | Ishida | G01R 31/31709 375/224 |
| 2008/0205016 A1* | 8/2008 | Takatori | H01L 23/5385 361/792 |
| 2010/0220092 A1* | 9/2010 | Kimura | G09G 3/3233 345/213 |
| 2011/0005090 A1* | 1/2011 | Lee | G01D 5/145 33/1 PT |
| 2014/0300649 A1* | 10/2014 | Park | G09G 3/006 345/690 |
| 2014/0319523 A1* | 10/2014 | Lee | H01L 22/34 257/48 |
| 2014/0368228 A1* | 12/2014 | Kim | G02F 1/1309 324/750.3 |
| 2015/0115251 A1* | 4/2015 | Jinta | H01L 51/5234 257/40 |

FOREIGN PATENT DOCUMENTS

| | | |
|---|---|---|
| KR | 10-1112621 | 2/2012 |
| KR | 2014-0112634 | 9/2014 |

* cited by examiner

DISPLAY DEVICE

CROSS-REFERENCE TO RELATED APPLICATION

This application claims priority under 35 U.S.C. § 119 to Korean Patent Application No. 10-2016-0162791, filed on Dec. 1, 2016, in the Korean Intellectual Property Office (KIPO), the disclosure of which is incorporated by reference herein in its entirety.

1. Technical Field

Embodiments of the present inventive concept relate to a display device.

2. Discussion of Related Art

Display devices are classified into liquid crystal display ("LCD") devices, organic light emitting diode ("OLED") display devices, plasma display panel ("PDP") devices, electrophoretic display devices, or the like based on a light emitting scheme thereof.

Such a display device includes a display panel for displaying an image, a plurality of pixels arranged at the display panel, a driving circuit driving the plurality of pixels, a control circuit controlling a driving timing of each pixel by applying control signals to the driving circuit and a power circuit generating and outputting driving voltages having multiple levels.

In recent times, the driving circuit, the control circuit, the power circuit or the like for driving the display panel are formed into at least one integrated circuit ("IC") and the display device includes a plurality of electric elements to apply multiple signals to each of the plurality of ICs. Examples of the plurality of electric elements may include a resistor, an inductor, a capacitor, or the like and the various electric elements are located at the periphery of the IC.

In recent times, in particular, ICs or electric elements are mounted on a printed circuit board ("PCB") in which a host system with the display panel of the display device is configured. In such an example, the PCB may be a flexible printed circuit board ("FPCB").

In the case where the ICs and more particularly, the electric elements are formed on such an FPCB, disconnections of a signal line which connects the electric elements with another circuit or cracks of the FPCB itself may disadvantageously occur due to warping of the FPCB.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Embodiments of the present inventive concept may be directed to a display device capable of improving reliability of the display device by detecting defects of a PCB.

According to an exemplary embodiment, a display device includes: a display panel on which a driving integrated circuit is mounted; a printed circuit board disposed on at least one edge of the display panel and connected to the driving integrated circuit; a plurality of signal lines disposed on the printed circuit board; and an inspection portion connected to the plurality of signal lines. The inspection portion includes: a power line connected to one point of at least two signal lines of the plurality of signal lines to apply an inspection signal, the at least two signal lines including a first signal line and a second signal line; a first resistor connected to the first signal line; a second resistor connected to the second signal line; and a signal detection line connected to the first resistor and the second resistor to detect a change value of the inspection signal.

The inspection signal may be a direct current voltage.

The first resistor and the second resistor may have different resistance values.

The display device may further include a first switch connected between the power line and the first resistor, a second switch connected between the first resistor and the signal detection line, a third switch connected between the power line and the second resistor, and a fourth switch connected between the second resistor and the signal detection line.

The display device may further include a third signal line and a fourth signal line connected to the power line, a third resistor connected to the third signal line between the power line and the signal detection line, a fourth resistor connected to the fourth signal line between the power line and the signal detection line, a fifth switch connected between the power line and the third resistor, a sixth switch connected between the third resistor and the signal detection line, a seventh switch connected between the power line and the fourth resistor, and an eighth switch connected between the fourth resistor and the signal detection line.

The display device may further include a plurality of electric elements disposed on the printed circuit board and connected to the plurality of signal lines.

Each of the plurality of electric elements may be one of a resistor, an inductor and a capacitor.

The inspection portion may further include at least one switch connected to the power line.

The inspection portion may further include at least one switch connected to the signal detection line.

The printed circuit board may be bent along at least one side surface of the display panel.

The printed circuit board may include at least one material of kapton, polyethersulphone, polycarbonate, polyimide, polyethylene terephthalate, polyethylenenaphthalate, polyacrylate and fiber reinforced plastic.

The display device may further include a backlight assembly providing a light to the display panel.

The foregoing is illustrative only and is not intended to be in any way limiting. In addition to the illustrative aspects, exemplary embodiments and features described above, further aspects, exemplary embodiments and features will become apparent by reference to the drawings and the following detailed description.

BRIEF DESCRIPTION OF THE DRAWINGS

A more complete appreciation of the present inventive concept will become more apparent by describing in detail exemplary embodiments thereof with reference to the accompanying drawings, wherein.

DETAILED DESCRIPTION

Exemplary embodiments will now be described more fully hereinafter with reference to the accompanying drawings. Although the inventive concept may be modified in various manners and have several exemplary embodiments, exemplary embodiments are illustrated in the accompanying drawings and will be mainly described in the specification. However, the scope of the inventive concept is not limited to the exemplary embodiments and should be construed as including all the changes, equivalents and substitutions included in the spirit and scope of the inventive concept.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below," "beneath," "lower," "above," "upper" or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween.

It will be further understood that the terms "comprises," "including," "includes" and/or "including," when used in this specification, specify the presence of stated features, integers, steps, operations, elements and/or components, but do not preclude the presence or addition of one or more other features, integers, steps, operations, elements, components and/or groups thereof.

It will be understood that, although the terms "first," "second," "third," or the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this inventive concept pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to specifically describe embodiments of the present inventive concept and like reference numerals refer to like elements throughout the specification.

Hereinafter, an exemplary embodiment will be described with reference to FIGS. 1, 2, 3, 4, 5, 6A, 6B and 6C. Hereinafter, a display device according to an exemplary embodiment will be described on the assumption that it is an LCD device, but exemplary embodiments are not limited thereto and the display device may be an OLED display device. In addition, the display device according to an exemplary embodiment will be described on the assumption that it includes an edge type light source portion, but exemplary embodiments are not limited thereto, and may include a direct type light source portion or a corner type light source portion.

Figure 1:
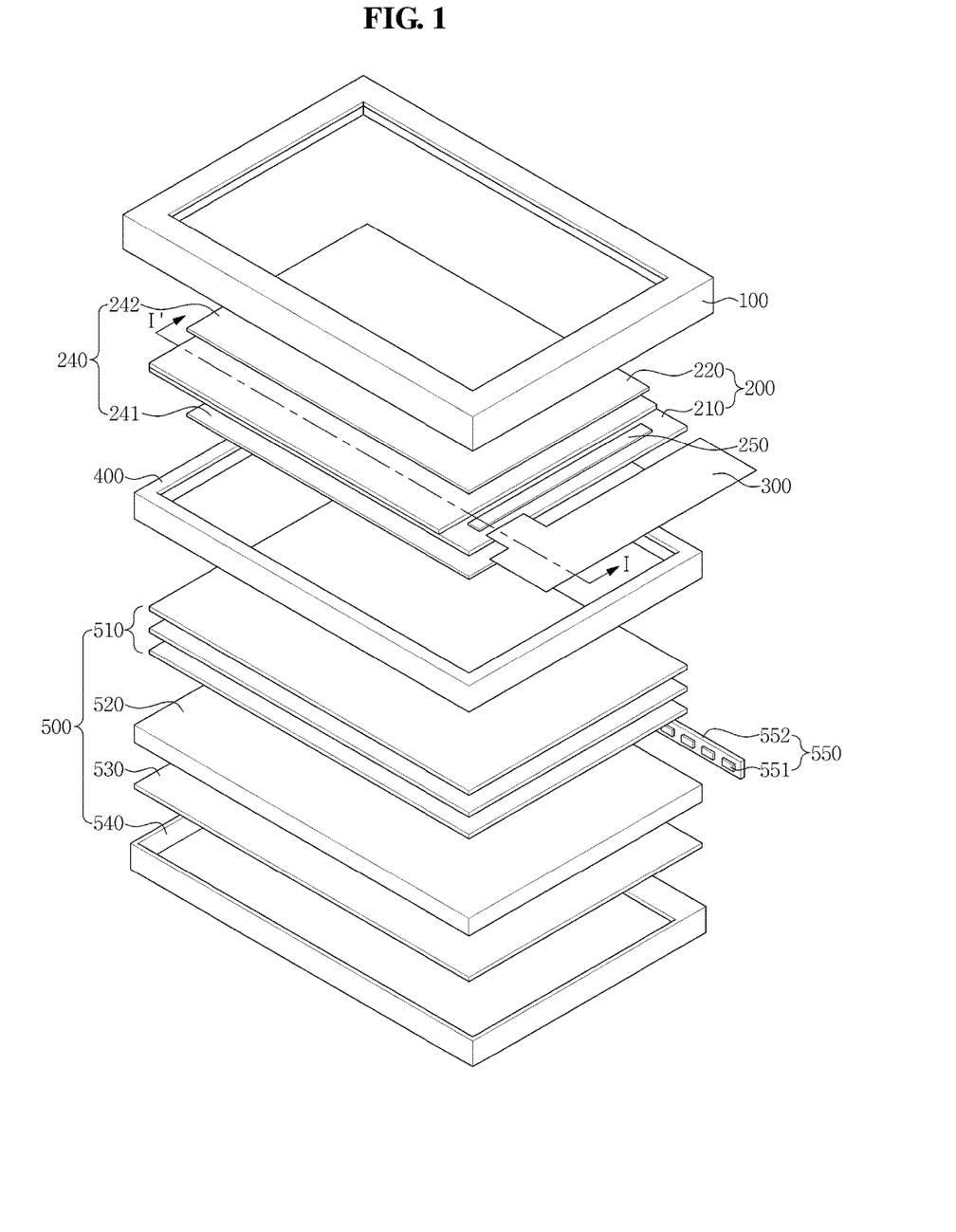
FIG. 1 is an exploded perspective view schematically illustrating a display device according to an exemplary embodiment.
Figure 2:
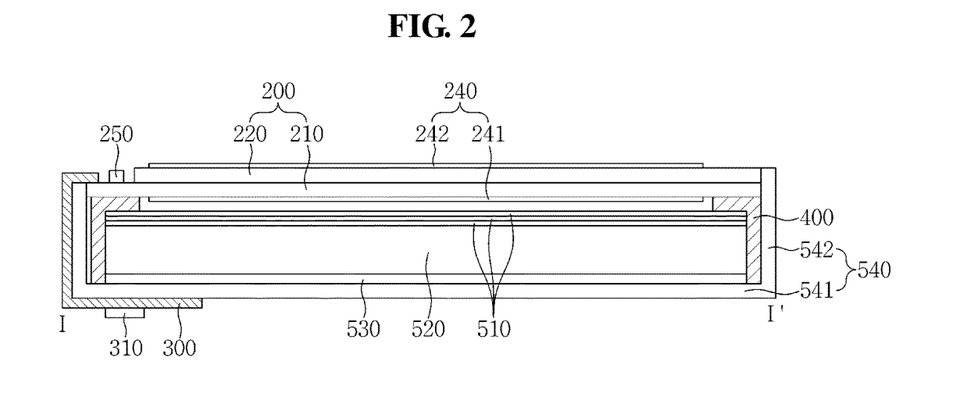
FIG. 2 is a cross-sectional view taken along the line I-I' of FIG. 1.

FIG. 1 is an exploded perspective view schematically illustrating a display device according to an exemplary embodiment, and FIG. 2 is a cross-sectional view taken along the line I-I' of FIG. 1.

Referring to FIGS. 1 and 2, the display device according to an exemplary embodiment includes a display panel 200 displaying an image, a PCB 300 connected to the display panel 200, a backlight assembly 500 providing a light to the display panel 200, an upper frame (or a top chassis) 100 in the form of covering the display panel 200 and an intermediate frame (or a mold frame) 400 on which the display panel 200 is mounted.

The upper frame 100 is coupled to a lower frame (or a bottom chassis) 540 to cover an edge of the display panel 200 mounted on the intermediate frame 400. The upper frame 100 may include a side surface portion coupled to the lower frame 540 and an upper surface portion bent from the side surface portion to extend therefrom.

The upper frame 100 fastens an edge of the display panel 200 to substantially prevent the display panel 200 from being dislocated from the backlight assembly 500. The edge of the display panel 200 covered by the upper frame 100 is a non-display area. The upper frame 100 has an open window at a center portion thereof through which the display panel 200 is exposed.

The upper frame 100 may be coupled to the lower frame 540 using a hook and/or a screw. In addition, the coupling of the upper frame 100 and the lower frame 540 may be modified in various ways.

The upper frame 100 may include a rigid metal material such as stainless steel or a material having good heat dissipation characteristics such as aluminum or an aluminum alloy.

The upper frame 100 may be formed through a press molding process or the like to have a predetermined curvature. In an exemplary embodiment, the upper frame 100 may be omitted depending on the type of the display device.

The display panel 200 displays an image. The display panel 200 is a light receiving type display panel, and examples of the display panel 200 may include an LCD panel, an electro-wetting display panel, an electrophoretic display panel, a microelectromechanical system ("MEMS") display panel or the like. Herein, an LCD panel will be described as the display panel 200 according to an exemplary embodiment by way of example. In addition, although not illustrated, the display panel 200 may be a flexible panel that may be bent in at least one direction.

The display panel 200 may be provided in a quadrangular plate shape having two pairs of sides parallel to each other. The display panel 200 according to an exemplary embodiment may have a rectangular shape having a pair of long sides and a pair of short sides. The display panel 200 includes a first substrate 210, a second substrate 220 opposing the first substrate 210 and a liquid crystal layer (not illustrated) disposed between the first substrate 210 and the second substrate 220.

The display panel 200 includes, in a plan view, a display area on which an image is displayed and a non-display area surrounding the display area. The non-display area is covered by the upper frame 100.

The first substrate 210 may include a plurality of pixel electrodes (not illustrated) and a plurality of thin film transistors (not illustrated) electrically connected in one-to-one correspondence with the pixel electrodes. A data line is connected to a source electrode of the thin film transistor, a gate line is connected to a gate electrode of the thin film transistor and a pixel electrode is connected to a drain electrode of the thin film transistor. Each thin film transistor transfers a driving signal to each corresponding one of the pixel electrodes. In addition, the second substrate 220 may include a common electrode (not illustrated) which, together with the pixel electrodes, forms an electric field for controlling liquid crystal arrangement. The display panel 200 drives the liquid crystal layer to display an image.

In addition, the display panel 200 includes a driving IC 250 mounted on the first substrate 210 to provide a driving signal. The driving IC 250 generates the driving signal for driving the display panel 200 in response to an external signal. The external signal is a signal supplied from the PCB 300, including an image signal, various control signals, a driving voltage or the like.

The PCB 300 is disposed on at least one edge of the display panel 200 and is electrically connected to the driving IC 250. That is, a part of the PCB 300 may be attached on the first substrate 210 of the display panel 200. For example, the PCB 300 may be electrically connected to the first substrate 210 through an anisotropic conductive film. As the PCB 300 is attached on the first substrate 210 of the display panel 200, the driving IC 250 may be electrically connected to electric elements 311 (see FIG. 3) and driving elements 330 (see FIG. 3) mounted on the PCB 300.

The PCB 300 attached to one edge of the display panel 200 is bent along a side wall portion 542 of the lower frame 540, to be described below, so as to be disposed on the side wall portion 542 or a lower surface of a bottom portion 541 of the lower frame 540. Accordingly, the plurality of electric elements 311 mounted on the PCB 300 may be disposed on the back surface of the display device. However, exemplary embodiments are not limited thereto and the PCB 300 may be bent between the intermediate frame 400 and the lower frame 540 to be disposed on an upper surface of the bottom portion 541 of the lower frame 540.

A polarizer 240 is disposed on the display panel 200 and includes a first polarizer 241 and a second polarizer 242. The first polarizer 241 and the second polarizer 242 are disposed on respective surfaces of the first substrate 210 and the second substrate 220 that are opposite to surfaces of the first substrate 210 and the second substrate 220 facing each other, respectively. That is, the first polarizer 241 may be attached to an outer side of the first substrate 210 and the second polarizer 242 may be attached to an outer side of the second substrate 220.

A transmission axis of the first polarizer 241 is substantially perpendicular to a transmission axis of the second polarizer 242. The first polarizer 241 may pass only specific polarized light among light output from the backlight assembly 500 and may absorb or block the other light. The second polarizer 242 may pass only specific polarized light among light externally incident thereto and may absorb or block the other light.

The intermediate frame 400 is coupled to the lower frame 540 and supports the display panel 200. The intermediate frame 400 is disposed along an edge of the display panel 200 to support the display panel 200 from below the display panel 200. The intermediate frame 400 may be provided at a position corresponding to four sides of the display panel 200 or a position corresponding to at least a part of the four sides thereof. For example, the intermediate frame 400 may have a quadrangular loop shape corresponding to the four sides of the display panel 200.

As illustrated in FIG. 2, the intermediate frame 400 includes a support portion supporting the display panel 200 and a side surface portion bent from the support portion. The intermediate frame 400 may include a flexible material such as plastic to substantially prevent breakage of the display panel 200. In addition, the intermediate frame 400 may include a metal material to ensure rigidity and fastening force with the lower frame 540. In the case where the intermediate frame 400 includes a metal material, the side surface portion may have a thickness in a range from about 0.1 mm to about 0.3 mm so as to be bent. However, exemplary embodiments are not limited thereto and the thickness of the side surface portion 320 may be variously set so that both ductility and rigidity of the side surface portion may be ensured.

The backlight assembly 500 includes an optical sheet 510, a light guide plate 520, a reflective sheet 530, the lower frame 540 and a light source portion 550.

The light source portion 550 includes a light source 551 and a circuit board 552 on which the light source 551 is disposed. The light source portion 550 may be disposed at an edge portion or a light incidence side surface of the light guide plate 520. That is, the light source portion 550 may emit a light to the edge portion or the light incidence side surface of the light guide plate 520.

The light source 551 may include at least one light emitting diode ("LED") chip and a package for accommodating the LED chip. The light source 551 may have an emission surface which faces the light guide plate 520. The light emitted from the light source 551 may be a blue light.

In such an exemplary embodiment, the light source 551 may be selectively driven according to a driving scheme of the display device. For example, in a wide viewing angle mode, the entirety of light sources 451 in an entire area of the emission surface may be driven, and in a narrow viewing angle mode, at least one light source 551 at a central area of the emission surface may be driven. In addition, the narrow viewing angle mode may be subdivided by adjusting the number of light emissions of the light sources 451 at the central area of the emission surface.

The circuit board 552 includes, for example, a PCB or a metal PCB.

The light source portion 550 may be formed at one side surface, two opposite side surfaces, four side surfaces or at least one corner portion of the light guide plate 520 in consideration of the size, luminance uniformity or the like of the display panel 200.

A heat dissipation member (not illustrated) may be disposed between the light source portion 550 and the lower frame 540. The heat dissipation member dissipates heat generated in the light source portion 550 to the outside. In the case where the light source portion 550 is arranged in a bar or line shape on one side surface of the lower frame 540, the heat dissipation member may also be provided as a metal frame having a bar or line shape. As described above, the heat dissipation member may have various shapes according to the shape of the light source portion 550.

The light guide plate 520 receives the light emitted from the light source 551 through the incidence side surface and emits the light toward the emission surface which faces the display panel 200. The light guide plate 520 uniformly supplies the light provided from the light source portion 550 to the display panel 200. The light guide plate 520 is disposed to face the light source portion 550 and accommodated in the lower frame 540. The light guide plate 520 may be formed in a quadrangular plate shape similar to the display panel 200, for example. However, exemplary embodiments are not limited thereto. In the case where the light source 551 such as an LED is used, the light guide plate 520 may include a predetermined groove or protrusion shape depending on the position of the light source 551.

Although the light guide plate 520 has been described as a plate for convenience of explanation, it may be formed as a sheet or a film to reduce a thickness of the display device. That is, the light guide plate 520 is to be understood as having a concept including both a plate and a film for guiding light.

The light guide plate 520 may include a light transmitting material, such as an acrylic resin, e.g., polymethylmethacrylate (PMMA), and polycarbonate (PC), to allow light to be efficiently guided.

A pattern may be formed on at least one surface of the light guide plate 520. For example, a scattering pattern may be formed on a lower surface of the light guide plate 520 so that a light guided to the bottom surface may be reflected toward the display panel 200.

The optical sheet 510 is disposed above the light guide plate 520 and diffuses and collimates the light incident thereon from the light guide plate 520. The optical sheet 510 may include a diffusion sheet, a prism sheet and a protective sheet.

The diffusion sheet diffuses the light guided from the light guide plate 520 so as to substantially prevent the light from being partially concentrated.

The prism sheet may include prisms, having a triangular cross-section, which are formed on one surface of the prism sheet in a predetermined arrangement. The prism sheet may be disposed on the diffusion sheet and serve to collimate the light diffused by the diffusion sheet in a direction perpendicular to the display panel 200.

The protective sheet may be formed on the prism sheet and serve to protect a surface of the prism sheet and diffuse the light to achieve uniform light distribution.

The reflective sheet 530 is disposed between the light guide plate 520 and the lower frame 540. The reflective sheet 530 reflects the light guided downwards of the light guide plate 520 to be directed toward the display panel 200, thus improving luminous efficiency.

The reflective sheet 530 may include, for example, polyethylene terephthalate (PET), thus having reflective characteristics and one surface of the reflective sheet 530 may be coated with a diffusion layer including, for example, titanium dioxide.

In an exemplary embodiment, the reflective sheet 530 may include a material including a metal such as silver (Ag).

The lower frame 540 accommodates the reflective sheet 530 and the light guide plate 520. The lower frame 540 includes the bottom portion 541 and the side wall portion 542 bent from the bottom portion 541. The bottom portion 541 of the lower frame 540 is disposed substantially parallel to the light guide plate 520. The side wall portion 542 defines an accommodation space of the lower frame 540. The lower frame 540 may include a rigid metal material such as stainless steel or a material having good heat dissipation properties such as aluminum or an aluminum alloy. The lower frame 540 according to an exemplary embodiment maintains the framework of the display device and protects various components accommodated therein.

Figure 3:
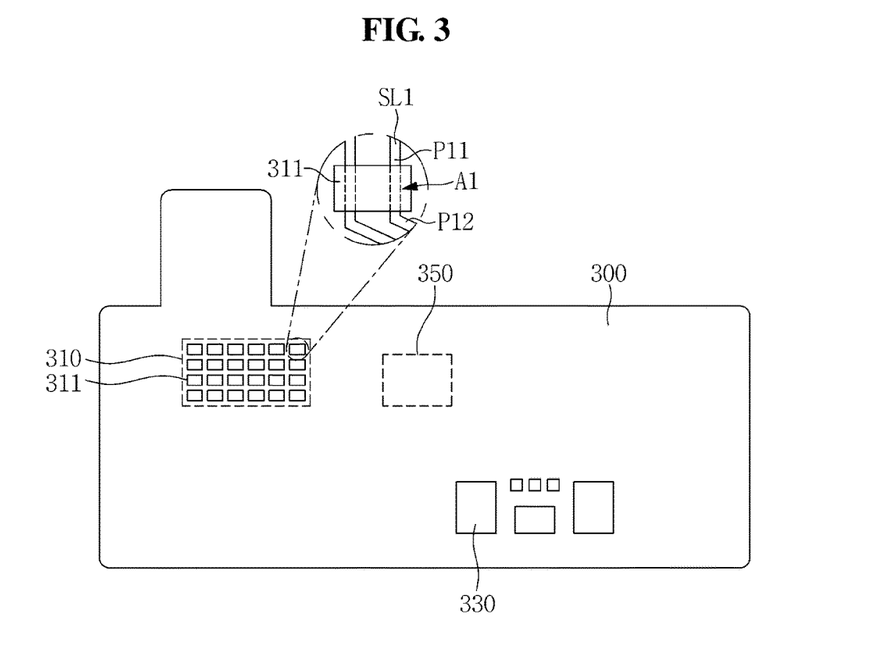
FIG. 3 is a plan view schematically illustrating a PCB according to an exemplary embodiment.
Figure 4:
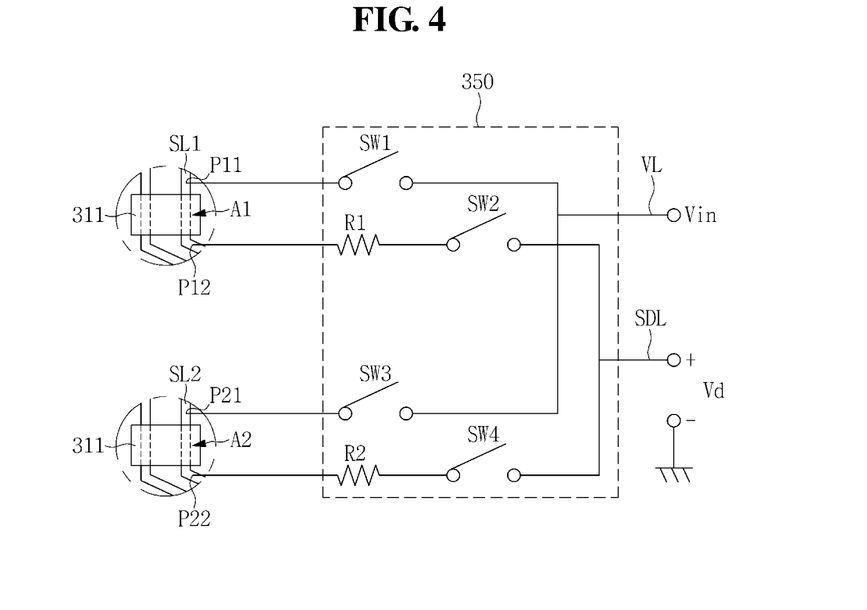
FIGS. 4 and 5 is a circuit diagram illustrating a configuration of an inspection portion according to an exemplary embodiment.
Figure 5:
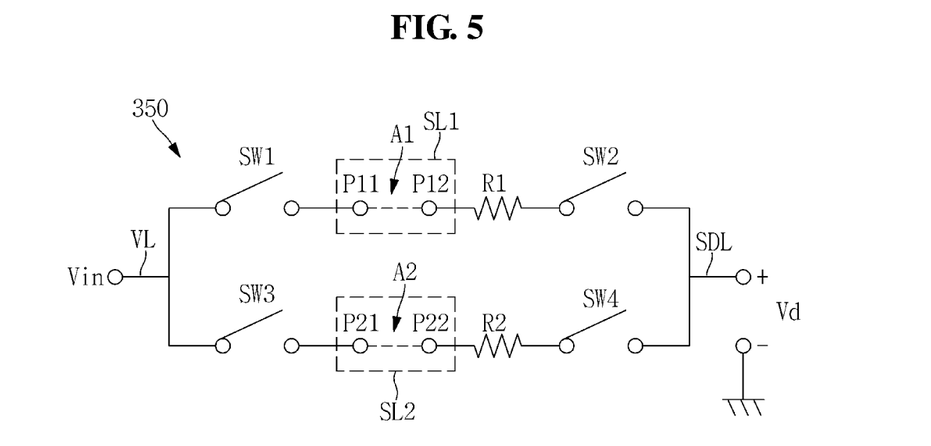
Figure 6A:
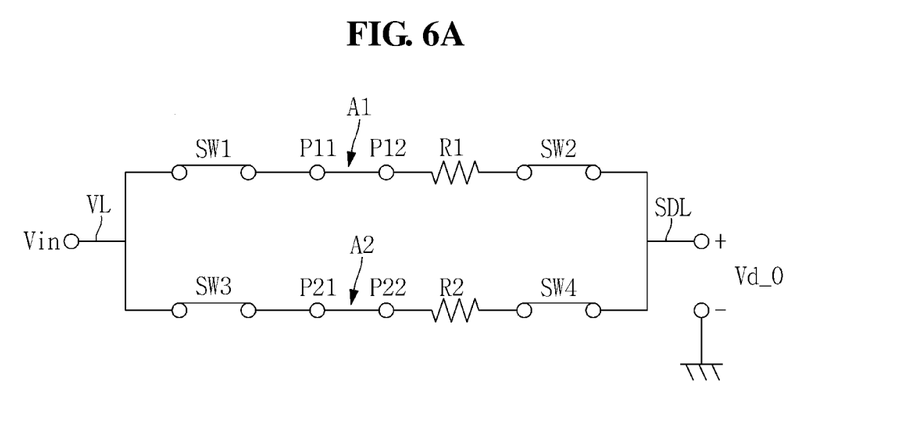
FIGS. 6A, 6B and 6C are circuit diagrams illustrating an operation of the inspection portion illustrated in FIG. 5.
Figure 6B:
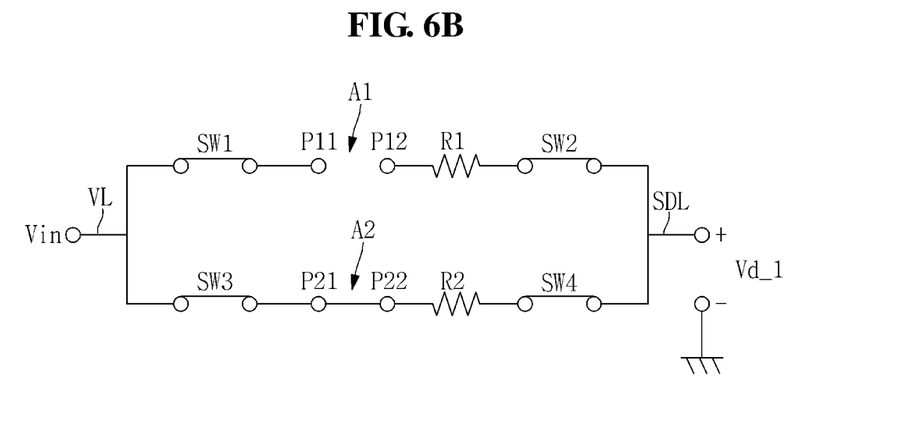
Figure 6C:
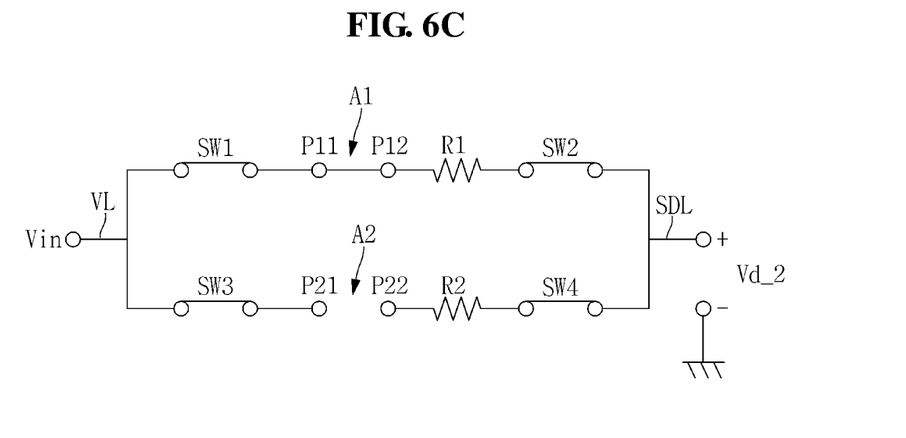

FIG. 3 is a plan view schematically illustrating a PCB according to an exemplary embodiment, FIGS. 4 and 5 is a circuit diagram illustrating a configuration of an inspection portion according to an exemplary embodiment, and FIGS. 6A, 6B and 6C are circuit diagrams illustrating an operation of the inspection portion illustrated in FIG. 5.

Referring to FIG. 3, the display device according to an exemplary embodiment includes the plurality of electric elements 311, the plurality of driving elements 330 and an inspection portion 350 disposed on the PCB 300. In addition, a plurality of signal lines for electric connection between the display panel 200, the driving IC 250, the plurality of electric elements 311, the plurality of driving elements 330 and the inspection portion 350 are formed on the PCB 300.

The PCB 300 according to an exemplary embodiment is a flexible printed circuit board (FPCB; or a flexible printed circuit film). The PCB 300 may include an FPCB alone, or may include an FPCB together with a non-flexible printed circuit board.

The PCB 300 may include at least one material of: kapton, polyethersulphone (PES), polycarbonate (PC), polyimide (PI), polyethyleneterephthalate (PET), polyethylene naphthalate (PEN), polyacrylate (PAR), fiber reinforced plastic (FRP) or the like.

The plurality of electric elements 311 and the plurality of driving elements 330 are mounted on the PCB 300 through a surface mounting technology (SMT) process. In such an exemplary embodiment, the plurality of electric elements 311 and the plurality of driving elements 330 may be densely mounted on the PCB 300 at respective predetermined positions. For example, the plurality of electric elements 311 may be densely mounted on a pad portion 310 including the plurality of signal lines.

Each of the plurality of electric elements 311 may be one of a resistor, an inductor and a capacitor. However, exemplary embodiments are not limited thereto and each of the plurality of electric elements 311 may be a transistor or a diode. In such an exemplary embodiment, one electric element 311 may be connected to two signal lines, as illustrated in FIG. 3. In addition, the plurality of electric elements 311 may be connected to different signal lines, respectively, and a part of the plurality of electric elements 311 may be connected to a same signal line.

As described above, one portion of the PCB 300 is electrically connected to the first substrate 210 and another portion of the PCB 300 is bent along one side surface of the display panel 200 to be disposed on the back surface of the display panel 200. In such an exemplary embodiment, as the PCB 300 is bent, a crack may occur at the PCB 300. Thus, the plurality of signal lines disposed on the PCB 300 may be disconnected. In particular, the cracks of the PCB 300 may occur relatively frequently at an area on which the plurality of electric elements 311 are mounted, and accordingly, disconnection defects may occur at the signal line overlapping the plurality of electric elements 311.

Accordingly, the display device according to an exemplary embodiment further includes the inspection portion 350 which may easily identify whether the plurality of signal lines overlapping the plurality of electric elements 311 are disconnected.

Referring to FIGS. 3, 4 and 5, the inspection portion 350 may be connected to at least two signal lines having a relatively high possibility of disconnection among the plurality of signal lines. For example, when one signal line overlapping one electric element 311 is defined as a first signal line SL1 and an area having a relatively high possibility of disconnection at the first signal line SL1 is defined as a first interest area A1, the inspection portion 350 may be connected to the first signal line SL1 at arbitrary two points P11 and P12 that have the first interest area A1 interposed therebetween.

Similarly, when another signal line overlapping another electric element 311 is defined as a second signal line SL2 and an area having a relatively high possibility of disconnection at the second signal line SL2 is defined as a second interest area A2, the inspection portion 350 may be connected to the second signal line SL2 at arbitrary two points P21 and P22 that have the second interest area A2 therebetween.

Referring to FIGS. 4 and 5, the inspection portion 350 according to an exemplary embodiment includes a power line VL, first and second resistors R1 and R2, first, second, third and fourth switches SW1, SW2, SW3 and SW4 and a signal detection line SDL.

The power line VL is connected to each of the first and second signal lines SL1 and SL2, e.g., at points P11 and P21. For example, the power line VL is connected to one point P11 of the first signal line SL1 through the first switch SW1 and connected to one point P21 of the second signal line SL2 through the third switch SW3.

That is, the first switch SW1 is connected between the power line VL and one point P11 of the first signal line SL1 to perform a switching operation and the third switch SW3 is connected between the power line VL and one point P21 of the second signal line SL2 to perform a switching operation.

The power line VL applies an inspection signal to the first and second signal lines SL1 and SL2. In such an exemplary embodiment, the inspection signal according to an exemplary embodiment is a direct current ("DC") voltage Vin. That is, the power line VL receives the DC voltage Vin from a power source (not illustrated) and transmits the DC voltage Vin to the first and second interest areas A1 and A2 of the first and second signal lines SL1 and SL2 through the first and third switches SW1 and SW3, respectively.

The power source may be included in a power supply (not illustrated) disposed on the non-display area of the display panel 200.

The first and second resistors R1 and R2 are connected to another point of each corresponding one of the first and second signal lines SL1 and SL2, e.g., at points P12 and P22. For example, the first resistor R1 is connected to another point P12 of the first signal line SL1 and the second resistor R2 is connected to another point P22 of the second signal line SL2. In such an exemplary embodiment, the first resistor R1 and the second resistor R2 respectively have different resistance values.

The signal detection line SDL is connected to the first and second resistors R1 and R2. For example, the signal detection line SDL is connected to the first resistor R1 through the second switch SW2 and connected to the second resistor R2 through the fourth switch SW4.

That is, the second switch SW2 is connected between the first resistor R1 and the signal detection line SDL to perform a switching operation and the fourth switch SW4 is connected between the second resistor R2 and the signal detection line SDL to perform a switching operation.

The signal detection line SDL outputs a modified inspection signal which is modified by the inspection portion 350. According to an exemplary embodiment, the change value is a DC voltage Vd which is lower than the inspection signal Vin. That is, the DC voltage Vin applied through the power line VL is lowered by the first and second resistors R1 and R2, and the signal detection line SDL may output the DC voltage Vd which has been lowered to a signal detection portion (not illustrated).

The signal detection portion may be included in the driving IC 250 mounted on the display panel 200 or may be included in the driving element 330 mounted on the PCB 300.

Referring to FIGS. 6A, 6B and 6C, in order to identify whether the first and second signal lines SL1 and SL2 are disconnected at the first and second interest areas A1 and A2, the first, second, third and fourth switches SW1, SW2, SW3 and SW4 are all turned on.

In such an exemplary embodiment, FIG. 6A shows a case where both of the first and second signal lines SL1 and SL2 are not disconnected, FIG. 6B shows a case where the first signal line SL1 is disconnected in the first interest area A1, and FIG. 6C shows a case where the second signal line SL2 is disconnected in the second interest area A2.

In the case where both of the first and second signal lines SL1 and SL2 are not disconnected, as illustrated in FIG. 6A, the first resistor R1 and the second resistor R2 are connected in parallel with each other between the power line VL and the signal detection line SDL.

Accordingly, the DC voltage Vin applied through the power line VL is lowered by a combined resistance of the first and second resistors R1 and R2 and the signal detection line SDL outputs a normal DC voltage Vd_0 which has been lowered by the combined resistance of the first and second resistors R1 and R2. In other words, in the case where the first and second signal lines SL1 and SL2 are both in a non-disconnected steady state, the signal detection line SDL outputs the normal DC voltage Vd_0.

In the case where the first signal line SL1 is disconnected in the first interest area A1 and the second signal line SL2 is not disconnected, as illustrated in FIG. 6B, only the second resistor R2 is connected between the power line VL and the signal detection line SDL.

Accordingly, the DC voltage Vin applied through the power line VL is lowered by the second resistor R2 and the signal detection line SDL outputs a first DC voltage Vd_1 which has been lowered by a resistance of the second resistor R2. In other words, in the case where the first signal line SL1 is disconnected in the first interest area A1 and the second signal line SL2 is not disconnected, the signal detection line SDL outputs the first DC voltage Vd_1.

In the case where the second signal line SL2 is disconnected in the second interest area A2 and the first signal line SL1 is not disconnected, as illustrated in FIG. 6C, only the first resistor R1 is connected between the power line VL and the signal detection line SDL.

Accordingly, the DC voltage Vin applied through the power line VL is lowered by the first resistor R1 and the signal detection line SDL outputs a second DC voltage Vd_2 which has been lowered by a resistance of the first resistor R1. In other words, in the case where the second signal line SL2 is disconnected in the second interest area A2 and the first signal line SL1 is not disconnected, the signal detection line SDL outputs the second DC voltage Vd_2.

In such an exemplary embodiment, since the first resistor R1 and the second resistor R2 have different resistance values, the combined resistance of the first and second resistors R1 and R2, the resistance of the second resistor R2 and the resistance of the first resistor R1 respectively have different values. Accordingly, depending on whether the first and second signal lines SL1 and SL2 are disconnected, a voltage drop amount of the DC voltage Vin applied through the power line VL is changed. Accordingly, the signal detection line SDL outputs different DC voltages Vd_0, Vd_1 and Vd_2 depending on whether the first and second signal lines SL1 and SL2 are disconnected, respectively.

For example, in the case where the first and second resistors R1 and R2 are connected in parallel to each other, the combined resistance of the first and second resistors R1 and R2 is less than the resistance of the first resistor R1 and less than the resistance of the second resistor R2. Accordingly, a voltage drop amount when the first and second resistors R1 and R2 are connected in parallel with each other between the power line VL and the signal detection line SDL is less than a voltage drop amount of a case where any one of the first and second resistors R1 and R2 is connected between the power line VL and the signal detection line SDL. Accordingly, the normal DC voltage Vd_0 output from the signal detection line SDL is greater than the first and second DC voltages Vd_1 and Vd_2.

In addition, in the case where the resistance of the second resistor R2 is less than the resistance of the first resistor R1, a voltage drop amount when only the second resistor R2 is connected between the power line VL and the signal detection line SDL is less than a voltage drop amount when only the first resistor R1 is connected between the power line VL and the signal detection line SDL. Accordingly, the first DC voltage Vd_1 output from the signal detection line SDL is greater than the second DC voltage Vd_2.

Accordingly, the display device according to an exemplary embodiment may identify whether the plurality of signal lines are disconnected by further including the inspection portion 350 on the PCB 300. In addition, the inspection portion 350 may identify which signal line of the plurality of signal lines is disconnected by including the plurality of resistors respectively having different resistance values.

Hereinafter, an alternative exemplary embodiment will be described with reference to FIG. 7. The description of the same configurations as those of an exemplary embodiment will be omitted for convenience of explanation.

Figure 7:
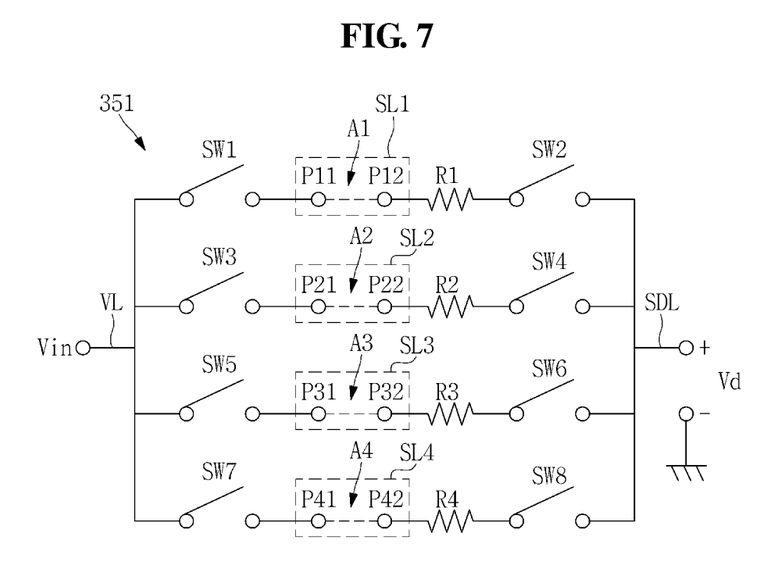
FIG. 7 is a circuit diagram illustrating a configuration of an inspection portion according to an alternative exemplary embodiment.

FIG. 7 is a circuit diagram illustrating a configuration of an inspection portion according to an alternative exemplary embodiment.

Referring to FIG. 7, an inspection portion 351 according to an alternative exemplary embodiment includes a power line VL, first, second, third and fourth resistors R1, R2, R3 and R4, first, second, third, fourth, fifth, sixth, seventh and eighth switches SW1, SW2, SW3, SW4, SW5, SW6, SW7 and SW8 and a signal detection line SDL.

The inspection portion 351 according to an alternative exemplary embodiment is connected to four signal lines SL1, SL2, SL3 and SL4 having a relatively high possibility of disconnection among a plurality of signal lines. However, exemplary embodiments are not limited thereto and the inspection portion 351 may be connected to five or more signal lines.

For example, when one signal line overlapping one electric element 311 is defined as a first signal line SL1 and an area having a relatively high possibility of disconnection at the first signal line SL1 is defined as a first interest area A1, the inspection portion 351 may be connected to the first signal line SL1 at arbitrary two points P11 and P12 that have the first interest area A1 interposed therebetween.

In addition, when another signal line overlapping another electric element 311 is defined as a second signal line SL2 and an area having a relatively high possibility of disconnection at the second signal line SL2 is defined as a second interest area A2, the inspection portion 351 may be connected to the second signal line SL2 at arbitrary two points P21 and P22 that have the second interest area A2 therebetween.

In addition, when yet another signal line overlapping yet another electric element 311 is defined as a third signal line SL3 and an area having a relatively high possibility of disconnection at the third signal line SL3 is defined as a third interest area A3, the inspection portion 351 may be connected to the third signal line SL3 at arbitrary two points P31 and P32 that have the third interest area A3 therebetween.

In addition, when still another signal line overlapping still another electric element 311 is defined as a fourth signal line SL4 and an area having a relatively high possibility of disconnection at the fourth signal line SL4 is defined as a fourth interest area A4, the inspection portion 351 may be connected to the fourth signal line SL4 at arbitrary two points P41 and P42 that have the fourth interest area A4 therebetween.

The power line VL is connected to one point of each of the first, second, third and fourth signal lines SL1, SL2, SL3 and SL4, e.g., at points P11, P21, P31 and P41. For example, the power line VL is connected to one point P11 of the first signal line SL1 through the first switch SW1, one point P21 of the second signal line SL2 through the third switch SW3, one point P31 of the third signal line SL3 through the fifth switch SW5 and one point P41 of the fourth signal line SL4 through the seventh switch SW7.

The first, second, third and fourth resistors R1, R2, R3 and R4 are connected to another point of each corresponding one of the first, second, third and fourth signal lines SL1, SL2, SL3 and SL4, e.g., at points P12, P22, P32 and P42. For example, the first resistor R1 is connected to another point P12 of the first signal line SL1, the second resistor R2 is connected to another point P22 of the second signal line SL2, the third resistor R3 is connected to another point P32 of the third signal line SL3, and the fourth resistor R4 is connected to another point P42 of the fourth signal line SL4. In such an exemplary embodiment, the first, second, third and fourth resistors R1, R2, R3 and R4 respectively have different resistance values.

The signal detection line SDL is connected to the first, second, third and fourth resistors R1, R2, R3 and R4. For example, the signal detection line SDL is connected to the first resistor R1 through the second switch SW2, connected to the second resistor R2 through the fourth switch SW4, connected to the third resistor R3 through the sixth switch SW6 and connected to the fourth resistor R4 through the eighth switch SW8.

In the case where all of the first, second, third and fourth signal lines SL1, SL2, SL3 and SL4 are not disconnected, the first, second, third and fourth resistors R1, R2, R3 and R4 are connected in parallel with each other between the power line VL and the signal detection line SDL.

In the case where the first signal line SL1 is disconnected in the first interest area A1 and the second, third and fourth signal lines SL2, SL3 and SL4 are not disconnected, the second, third and fourth resistors R2, R3 and R4 are connected in parallel with each other between the power line VL and the signal detection line SDL.

In the case where the second signal line SL2 is disconnected in the second interest area A2 and the first, third and fourth signal lines SL1, SL3 and SL4 are not disconnected, the first, third and fourth resistors R1, R3 and R4 are connected in parallel with each other between the power line VL and the signal detection line SDL.

In the case where the third signal line SL3 is disconnected in the third interest area A3 and the first, second and fourth signal lines SL1, SL2 and SL4 are not disconnected, the first, second and fourth resistors R1, R2 and R4 are connected in parallel with each other between the power line VL and the signal detection line SDL.

In the case where the fourth signal line SL4 is disconnected in the fourth interest area A4 and the first, second and third signal lines SL1, SL2 and SL3 are not disconnected, the first, second and third resistors R1, R2 and R3 are connected in parallel with each other between the power line VL and the signal detection line SDL.

As described above, since the first, second, third and fourth resistors R1, R2, R3 and R4 respectively have different resistance values, a combined resistance of the first, second, third and fourth resistors R1, R2, R3 and R4, a combined resistance of the second, third and fourth resistors R2, R3 and R4, a combined resistance of the first, third and fourth resistors R1, R3 and R4, a combined resistance of the first, second and fourth resistors R1, R2 and R4 and a combined resistance of the first, second and third resistors R1, R2 and R3 respectively have different values.

Accordingly, depending on whether the first, second, third and fourth signal lines SL1, SL2, SL3 and SL4 are disconnected, a voltage drop amount of a DC voltage Vin applied through the power line VL is changed. Accordingly, the signal detection line SDL outputs different DC voltages depending on whether the first, second, third and fourth signal lines SL1, SL2, SL3 and SL4 are disconnected, respectively.

Accordingly, the display device according to an alternative exemplary embodiment may identify whether the plurality of signal lines are disconnected by further including the inspection portion 351 on the PCB 300. In addition, the inspection portion 351 may identify which signal line of the plurality of signal lines is disconnected by including the plurality of resistors having different resistance values.

Hereinafter, another alternative exemplary embodiment will be described with reference to FIG. 8. The description of the same configurations as those of an exemplary embodiment will be omitted for convenience of explanation.

Figure 8:
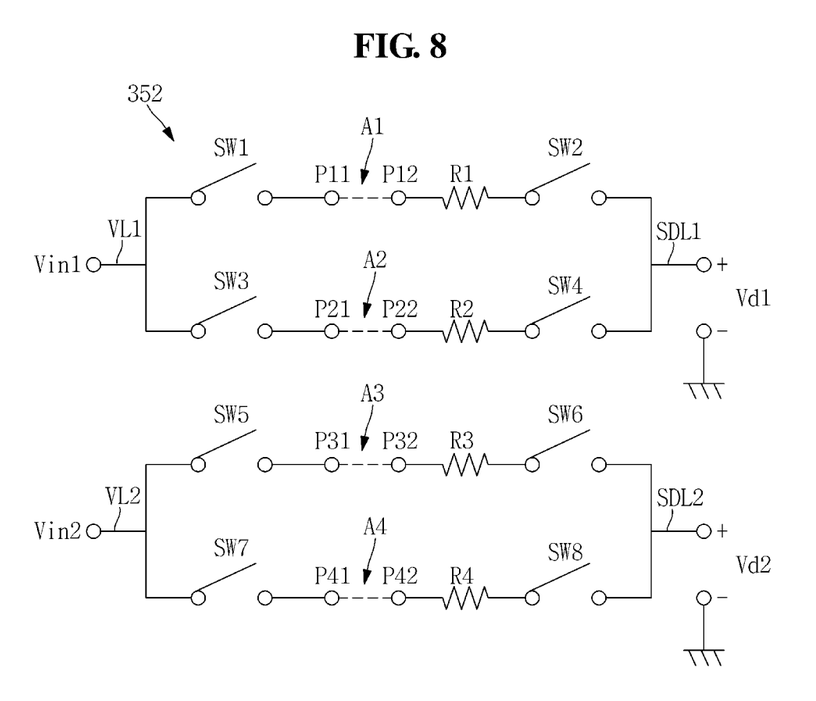
FIG. 8 is a circuit diagram illustrating a configuration of an inspection portion according to another alternative exemplary embodiment.

FIG. 8 is a circuit diagram illustrating a configuration of an inspection portion according to another alternative exemplary embodiment.

Referring to FIG. 8, an inspection portion 352 according to another alternative exemplary embodiment includes first and second power lines VL1 and VL2, first, second, third and fourth resistors R1, R2, R3 and R4, first, second, third, fourth, fifth, sixth, seventh and eighth switches SW1, SW2, SW3, SW4, SW5, SW6, SW7 and SW8 and first and second signal detection lines SDL1 and SDL2.

The first power line VL1 is connected to one point of each of the first and second signal lines SL1 and SL2, e.g., at points P11 and P21. For example, the first power line VL1 is connected to one point P11 of the first signal line SL1 through the first switch SW1 and connected to one point P21 of the second signal line SL2 through the third switch SW3.

The second power line VL2 is connected to one point of each of the third and fourth signal lines SL3 and SL4, e.g., at points P31 and P41. For example, the second power line VL2 is connected to one point P31 of the third signal line SL3 through the fifth switch SW5 and connected to one point P41 of the fourth signal line SL4 through the seventh switch SW7.

The first power line VL1 applies an inspection signal to the first and second signal lines SL1 and SL2. In addition, the second power line VL2 applies an inspection signal to the third and fourth signal lines SL3 and SL4. In such an exemplary embodiment, the inspection signals according to another alternative exemplary embodiment are DC voltages Vin1 and Vin2. The DC voltages Vin1 and Vin2 of the first and second power lines VL1 and VL2 may be a substantially equal DC voltage.

The first, second, third and fourth resistors R1, R2, R3 and R4 are connected to another point of each corresponding one of the first, second, third and fourth signal lines SL1, SL2, SL3 and SL4, e.g., at points P12, P22, P32 and P42. For example, the first resistor R1 is connected to another point P12 of the first signal line SL1, the second resistor R2 is connected to another point P22 of the second signal line SL2, the third resistor R3 is connected to another point P32 of the third signal line SL3, and the fourth resistor R4 is connected to another point P42 of the fourth signal line SL4. In such an exemplary embodiment, the first and second resistors R1 and R2 have different resistance values and the third and fourth resistors R3 and R4 have different resistance values.

The first signal detection line SDL1 is connected to the first and second resistors R1 and R2. For example, the first signal detection line SDL1 is connected to the first resistor R1 through the second switch SW2 and connected to the second resistor R2 through the fourth switch SW4.

The first signal detection line SDL1 outputs a change value of the inspection signal. According to another alternative exemplary embodiment, the change value is a DC voltage Vd1 after a voltage drop. That is, the DC voltage Vin1 applied through the first power line VL1 is lowered by the first and second resistors R1 and R2 and the first signal detection line SDL1 may output the DC voltage Vd1 which has been lowered to a signal detection portion.

The second signal detection line SDL2 is connected to the third and fourth resistors R3 and R4. For example, the second signal detection line SDL2 is connected to the third resistor R3 through the sixth switch SW6 and connected to the fourth resistor R4 through the eighth switch SW8.

The second signal detection line SDL2 outputs a change value of the inspection signal. According to another alternative exemplary embodiment, the change value is a DC voltage Vd2 after a voltage drop. That is, the DC voltage Vin2 applied through the second power line VL2 is lowered by the third and fourth resistors R3 and R4 and the second signal detection line SDL2 may output the DC voltage Vd2 which has been lowered to the signal detection portion.

In such an exemplary embodiment, since the first resistor R1 and the second resistor R2 have different resistance values, a combined resistance of the first and second resistors R1 and R2, a resistance of the second resistor R2 and a resistance of the first resistor R1 respectively have different values. Accordingly, depending on whether the first and second signal lines SL1 and SL2 are disconnected, a voltage drop amount of the DC voltage Vin1 applied through the first power line VL1 is changed. Accordingly, the first signal detection line SDL1 outputs different DC voltages depending on whether the first and second signal lines SL1 and SL2 are disconnected, respectively.

In addition, since the third resistor R3 and the fourth resistor R4 have different resistance values, a combined resistance of the third and fourth resistors R3 and R4, a resistance of the third resistor R3 and a resistance of the fourth resistor R4 respectively have different values. Accordingly, depending on whether the third and fourth signal lines SL3 and SL4 are disconnected, a voltage drop amount of the DC voltage Vin2 applied through the second power line VL2 is changed. Accordingly, the second signal detection line SDL2 outputs different DC voltages depending on whether the third and fourth signal lines SL3 and SL4 are disconnected, respectively.

Accordingly, the display device according to another alternative exemplary embodiment may identify whether the plurality of signal lines are disconnected by further including the inspection portion 352 on the PCB 300. In addition, the inspection portion 352 may identify which signal line of the plurality of signal lines is disconnected by including the plurality of resistors having different resistance values.

In addition, the circuit design may be modified unconstrainedly by including the plurality of power lines VL1 and VL2 and the plurality of signal detection lines SDL1 and SDL2.

As set forth hereinabove, according to one or more exemplary embodiments, the display device may detect disconnection defects of a PCB by forming an inspection portion on the PCB.

While the present inventive concept has been illustrated and described with reference to the exemplary embodiments thereof, it will be apparent to those of ordinary skill in the art that various changes in form and detail may be formed thereto without departing from the spirit and scope of the present inventive concept.

What is claimed is:

1. A display device comprising:
a display panel on which a driving integrated circuit is mounted;
a printed circuit board disposed on at least one edge of the display panel and connected to the driving integrated circuit;
a plurality of signal lines disposed on the printed circuit board; and
an inspection portion connected to the plurality of signal lines,
wherein the inspection portion comprises:
a power line connected to one point of at least two signal lines of the plurality of signal lines to apply an inspection signal, the at least two signal lines including a first signal line and a second signal line;
a first resistor connected to the first signal line;
a second resistor connected to the second signal line; and
a signal detection line connected to the first resistor and the second resistor to detect a change value of the inspection signal,
wherein the first resistor and the second resistor are connected in parallel with different resistance values.

2. The display device of claim 1, wherein the inspection signal is a direct current voltage.

3. The display device of claim 1, further comprising:
a first switch connected between the power line and the first resistor,
a second switch connected between the first resistor and the signal detection line,
a third switch connected between the power line and the second resistor, and
a fourth switch connected between the second resistor and the signal detection line.

4. The display device of claim 1, further comprising a plurality of electric elements disposed on the printed circuit board and connected to the plurality of signal lines.

5. The display device of claim 4, wherein each of the plurality of electric elements is one of a resistor, an inductor and a capacitor.

6. The display device of claim 1, wherein the inspection portion further comprises at least one switch connected to the power line.

7. The display device of claim 1, wherein the inspection portion further comprises at least one switch connected to the signal detection line.

8. The display device of claim 1, wherein the printed circuit board is bent along at least one side surface of the display panel.

9. The display device of claim 1, wherein the printed circuit board comprises at least one material of kapton, polyethersulphone, polycarbonate, polyimide, polyethylene terephthalate, polyethylenenaphthalate, polyacrylate and fiber reinforced plastic.

10. The display device of claim 1, further comprising a backlight assembly providing a light to the display panel.

11. A display device comprising:
a display panel on which a driving integrated circuit is mounted;
a printed circuit board disposed on at least one edge of the display panel and connected to the driving integrated circuit;
a plurality of signal lines disposed on the printed circuit board;
an inspection portion connected to the plurality of signal lines, the inspection portion comprising a power line connected to one point of at least two signal lines of the plurality of signal lines to apply an inspection signal, the at least two signal lines including a first signal line and a second signal line, a first resistor connected to the first signal line, a second resistor connected to the second signal line, and a signal detection line connected to the first resistor and the second resistor to detect a change value of the inspection signal;

a first switch connected between the power line and the first resistor;

a second switch connected between the first resistor and the signal detection line;

a third switch connected between the power line and the second resistor;

a fourth switch connected between the second resistor and the signal detection line;

a third signal line and a fourth signal line connected to the power line;

a third resistor connected to the third signal line between the power line and the signal detection line;

a fourth resistor connected to the fourth signal line between the power line and the signal detection line;

a fifth switch connected between the power line and the third resistor;

a sixth switch connected between the third resistor and the signal detection line;

a seventh switch connected between the power line and the fourth resistors; and an eighth switch connected between the fourth resistor and the signal detection line.

* * * * *